(12) United States Patent
Cheng et al.

(10) Patent No.: US 12,120,963 B2
(45) Date of Patent: Oct. 15, 2024

(54) CONTACT STRUCTURE FORMATION FOR MEMORY DEVICES

(71) Applicant: International Business Machines Corporation, Armonk, NY (US)

(72) Inventors: Lili Cheng, Rexford, NY (US); Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 644 days.

(21) Appl. No.: 17/484,934

(22) Filed: Sep. 24, 2021

(65) Prior Publication Data

US 2023/0109077 A1  Apr. 6, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10N 50/01* (2023.02); *H10B 61/22* (2023.02)

(58) Field of Classification Search
CPC ...... H10N 50/80; H10N 50/01; H10N 70/011; H10N 70/841; H10B 61/22; H10B 61/00; H10B 63/10; H10B 63/00
See application file for complete search history.

(56) References Cited

U.S. PATENT DOCUMENTS

| | | | |
|---|---|---|---|
| 7,211,849 B2 | 5/2007 | Hineman et al. | |
| 7,629,637 B2 | 12/2009 | Kajiyama et al. | |
| 8,283,186 B2 | 10/2012 | Kim | |
| 9,343,659 B1 | 5/2016 | Lu et al. | |
| 9,614,143 B2 | 4/2017 | Lu et al. | |
| 10,256,397 B2 | 4/2019 | Annunziata et al. | |
| 10,535,816 B2 | 1/2020 | Wu et al. | |
| 10,833,257 B1 | 11/2020 | Dutta et al. | |
| 2004/0081841 A1 | 4/2004 | Nakajima | |
| 2013/0032775 A1* | 2/2013 | Satoh | H10N 70/826 257/1 |
| 2013/0119494 A1 | 5/2013 | Li et al. | |
| 2016/0365505 A1 | 12/2016 | Lu et al. | |
| 2019/0273117 A1* | 9/2019 | Hung | H10N 50/80 |
| 2020/0266339 A1* | 8/2020 | Peng | H10B 61/20 |
| 2020/0357850 A1* | 11/2020 | Huang | H10N 50/80 |
| 2020/0403032 A1 | 12/2020 | Dutta et al. | |
| 2021/0091301 A1 | 3/2021 | Arnold et al. | |

FOREIGN PATENT DOCUMENTS

CN  111668366 A  9/2020

* cited by examiner

*Primary Examiner* — Shih Tsun A Chou
(74) *Attorney, Agent, or Firm* — L. Jeffrey Kelly; Ryan, Mason & Lewis, LLP

(57) ABSTRACT

A semiconductor structure comprises a bottom electrode contact, and a memory device comprising a bottom electrode disposed on the bottom electrode contact, at least one memory element layer disposed on the bottom electrode, and a top electrode disposed on the at least one memory element layer. A bit line contact is disposed on the top electrode and extends around sides of the memory device and of the bottom electrode contact. An encapsulation layer is disposed between the bit line contact and the sides of the memory device and of the bottom electrode contact.

20 Claims, 11 Drawing Sheets

100

100

100

100

CONTACT STRUCTURE FORMATION FOR MEMORY DEVICES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming memory device contact structures.

In one embodiment, a semiconductor structure comprises a bottom electrode contact, and a memory device comprising a bottom electrode disposed on the bottom electrode contact, at least one memory element layer disposed on the bottom electrode, and a top electrode disposed on the at least one memory element layer. A bit line contact is disposed on the top electrode and extends around sides of the memory device and of the bottom electrode contact. An encapsulation layer is disposed between the bit line contact and the sides of the memory device and of the bottom electrode contact.

In another embodiment, a semiconductor structure comprises an electrode contact disposed in a dielectric layer, a memory device disposed in the dielectric layer over the electrode contact, and a cap layer disposed around a base portion of the bottom electrode contact and having a curved profile. A height of the cap layer is less than a height of the electrode contact.

In another embodiment, a method of forming a semiconductor structure comprises forming an electrode contact structure in a dielectric cap layer, depositing a plurality of memory device layers on the dielectric cap layer, and patterning the plurality of memory device layers to form a memory device structure. The patterning gouges the dielectric cap layer at a base portion of the electrode contact structure. An encapsulation layer is formed on the gouged dielectric cap layer and around the electrode contact structure and the memory device structure. An inter-level dielectric layer is formed on sides of the electrode contact structure, the memory device structure and the encapsulation layer. The method further includes forming a contact trench in the inter-level dielectric layer. The contact trench is formed over the memory device structure and extends downward into inter-level dielectric layer around the sides of the electrode contact structure, memory device structure and the encapsulation layer.

DETAILED DESCRIPTION

Figure 1:
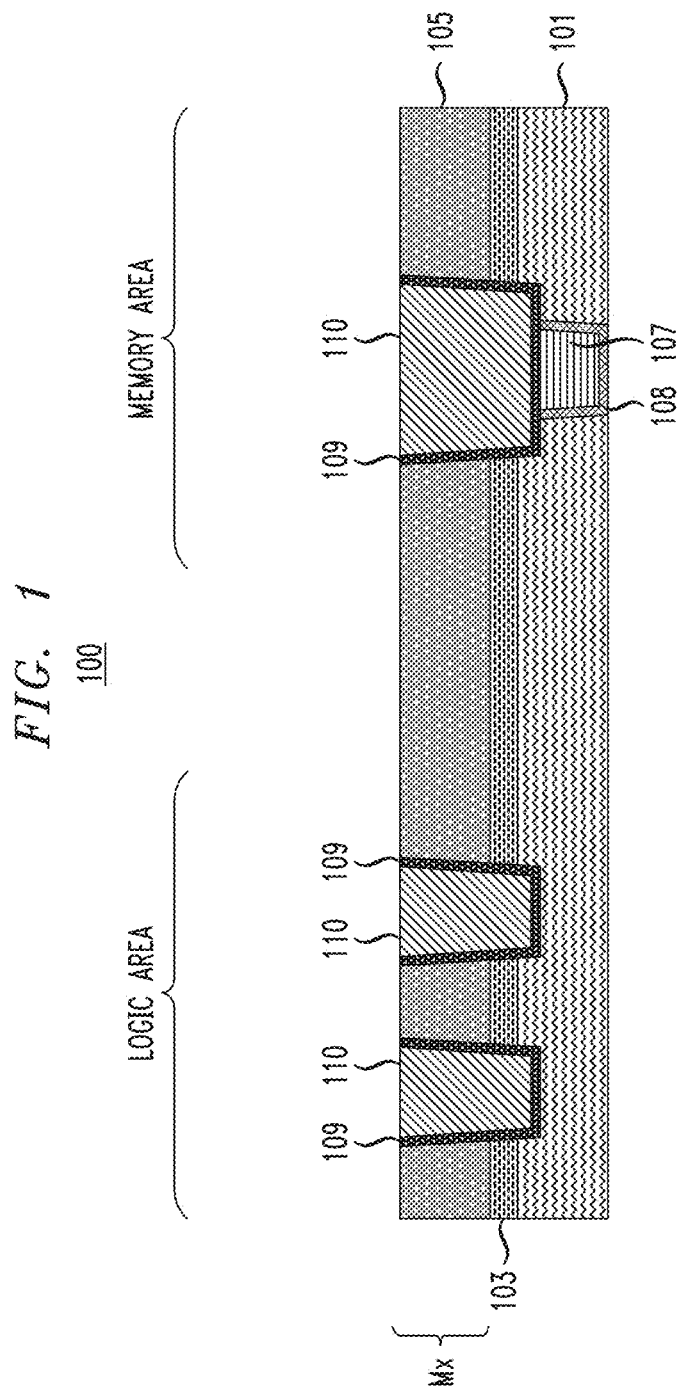
FIG. 1 is a schematic cross-sectional view illustrating a lower metallization level of a semiconductor structure including contacts in a logic area and in a memory area, according to an embodiment of the invention.

Illustrative embodiments of the invention may be described herein in the context of illustrative methods for forming memory device contact structures disposed on top and side surfaces of memory device top electrodes, and wrapping around encapsulated bottom electrode contacts, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Certain integration schemes require memory elements in the back-end-of-line (BEOL). Such memory elements may be formed in a column or pillar shape. The memory elements are included in memory devices such as, for example, phase-change random-access memory (PCRAM), resistive random-access memory (RRAM or ReRAM), and magnetic random-access memory (MRAM) devices.

In current memory devices, such as, for example, embedded MRAM devices, configurations corresponding to device and contact heights with respect to adjacent via heights limit the ability of the memory devices to fit into narrow inter-metal dielectric spaces. As a result, the usage of the memory devices (e.g., MRAM devices) as currently configured is limited in advanced node technologies. Additionally, with conventional techniques, there are undesirable levels of dielectric gouging at memory device areas during patterning of magnetic tunnel junction (MTJ) stacks, causing unwanted levels of dielectric cap material removal from the top of underlying metal lines.

Illustrative embodiments provide techniques for forming embedded memory devices where bottom electrode contacts are taller than nearby vias, and bit line metal contacts are formed on top and side surfaces of memory device top electrodes, and wrap around encapsulated bottom electrode contacts. The structures and techniques of the embodiments permit fitting of the memory devices into narrow inter-metal dielectric spacing, thus extending the usage of MRAM and other memory devices to more advanced node technologies. The embodiments also provide for thick dielectric cap layers, so that following patterning of memory element stacks, a gouged dielectric cap layer remains at the base portion of a bottom electrode contact, preventing unwanted damage of bottom electrode contacts and underlying metal lines.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials. As used herein, "high-k" refers to dielectric materials having a relative dielectric constant greater than 7.

FIG. 1 is a schematic cross-sectional view illustrating a lower metallization level of a semiconductor structure including contacts in a logic area and in a memory area. Referring to FIG. 1, a semiconductor device 100 includes a plurality of contacts each comprising a fill layer 110 and a liner layer 109 formed in a first inter-level dielectric (ILD) layer 105, and also extending through a first cap layer 103 and into a lower dielectric layer 101. The fill layers 110 are formed on the liner layers 109. The liner layers 109 include, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides. The liner layers are conformally formed on sidewalls and a bottom surface of a trench in the first ILD layer 105. The fill layers 110 include, an electrically conductive metal, such as, for example, tungsten, cobalt (Co), zirconium (Zr), tantalum (Ta), titanium (Ti), aluminum (Al), ruthenium (Ru), copper (Cu), metal carbides (e.g., tantalum carbide, titanium carbide, tantalum magnesium carbide), metal nitrides (e.g., titanium nitride), transition metal aluminides or combinations thereof. The liner and fill layers 109 and 110 are deposited using, for example, one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD), electroplating, and/or sputtering, which can be followed by a planarization process such as, for example, chemical mechanical polishing (CMP) to planarize a top surface of the first ILD layer 105 and remove excess portions of the liner and fill layers 109 and 110. The contacts and the first ILD layer 105 can form at least part of a lower metallization level ($M_x$).

Contacts, also referred to herein as wires or conductive lines, function as electrically conductive contacts or interconnects. The contacts form electrical connections between elements and/or devices, or to elements or devices. As used herein, a "contact" or "contact structure" includes a conductive fill layer, and may further include a liner layer.

The first ILD layer 105 comprises, for example, $SiO_x$, SiOC, ultra-low-k dielectrics or some other dielectric materials, and is formed on the first cap layer 103. The first ILD layer 105 is deposited using deposition techniques such as, for example, CVD, PECVD, RFCVD, PVD, ALD, MBD, PLD, and/or LSMCD, followed by a planarization process, such as, for example, CMP.

The first cap layer 103 comprises, for example, NBLoK™ material, a nitride material (e.g., silicon nitride (SiN), silicon carbonitride (SiCN)) or tetraethyl orthosilicate (TEOS) or other oxides, and is formed on the lower dielectric layer 101. NBLoK™ material is from Applied Materials, Inc. of Santa Clara, CA, and is a nitrogen-doped silicon carbide. As can be seen, the first cap layer 103 is deposited on top surfaces of the lower dielectric layer 101.

The lower dielectric layer 101 includes, for example, silicon dioxide ($SiO_2$), carbon-doped silicon oxide (SiCOH), SILK® dielectrics, TEOS, porous forms of these low-k and ultra-low-k dielectric films, flowable dielectrics and/or spin-on dielectrics. As can be understood by one of ordinary skill in the art, the lower dielectric layer 101 can be on a semiconductor substrate (not shown), with intervening layers (e.g., lower conductive lines, devices, etc.) between the lower dielectric layer 101 and the substrate. A semiconductor substrate may comprise semiconductor material including, but not limited to, Si, SiGe, SiC, SiGeC or other like semiconductor materials. In addition, multiple layers of the semiconductor materials can be used as the semiconductor material of the substrate. A plurality of devices can be on the substrate, such as, for example, transistors, capacitors, and resistors. A via comprising a fill layer 107 and a liner layer 108 the same or similar to the fill and liner layers 110 and 109 extends from the contact in the memory area and may be used to connect to one or more lower conductive lines and/or devices. Although not shown, similar vias may also extend from the contacts in the logic area.

Figure 2:
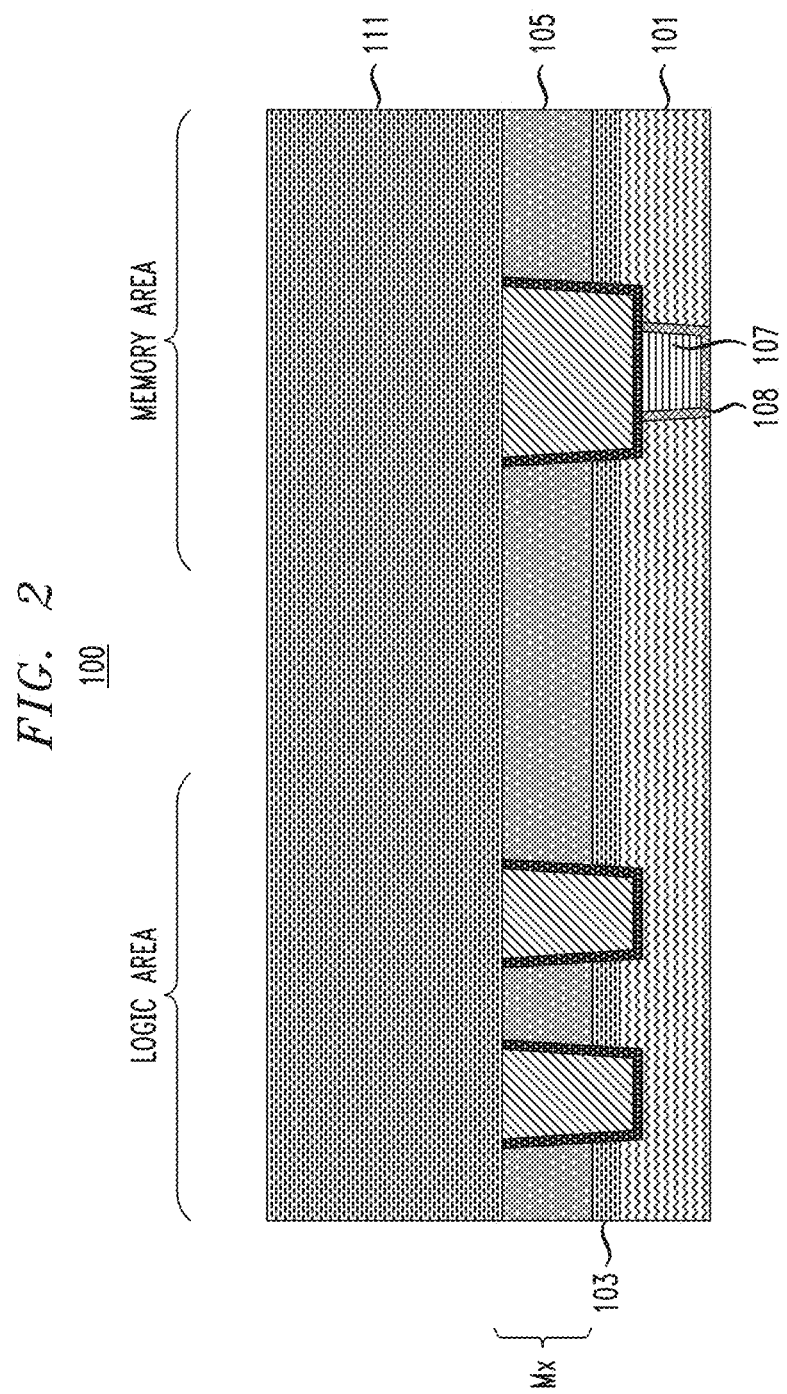
FIG. 2 is a schematic cross-sectional view illustrating formation of a dielectric cap layer on the structure of FIG. 1, according to an embodiment of the invention.

Referring to FIG. 2, a second cap layer 111 is deposited on the structure of FIG. 1. The second cap layer comprises the same or a similar material to that of the first cap layer 103, and is deposited using, for example, one or more deposition techniques, such as, but not necessarily limited to, PVD, CVD, ALD, PECVD, RFCVD, MLD, MBD, LSMCD and/or sputtering.

According to an embodiment, the thickness (e.g., vertical height) of the second cap layer 111 is larger than the thickness of the first cap layer 103. According to an embodiment, a thickness of the second cap layer is in the range of about 100 nm to about 300 nm.

Figure 3:
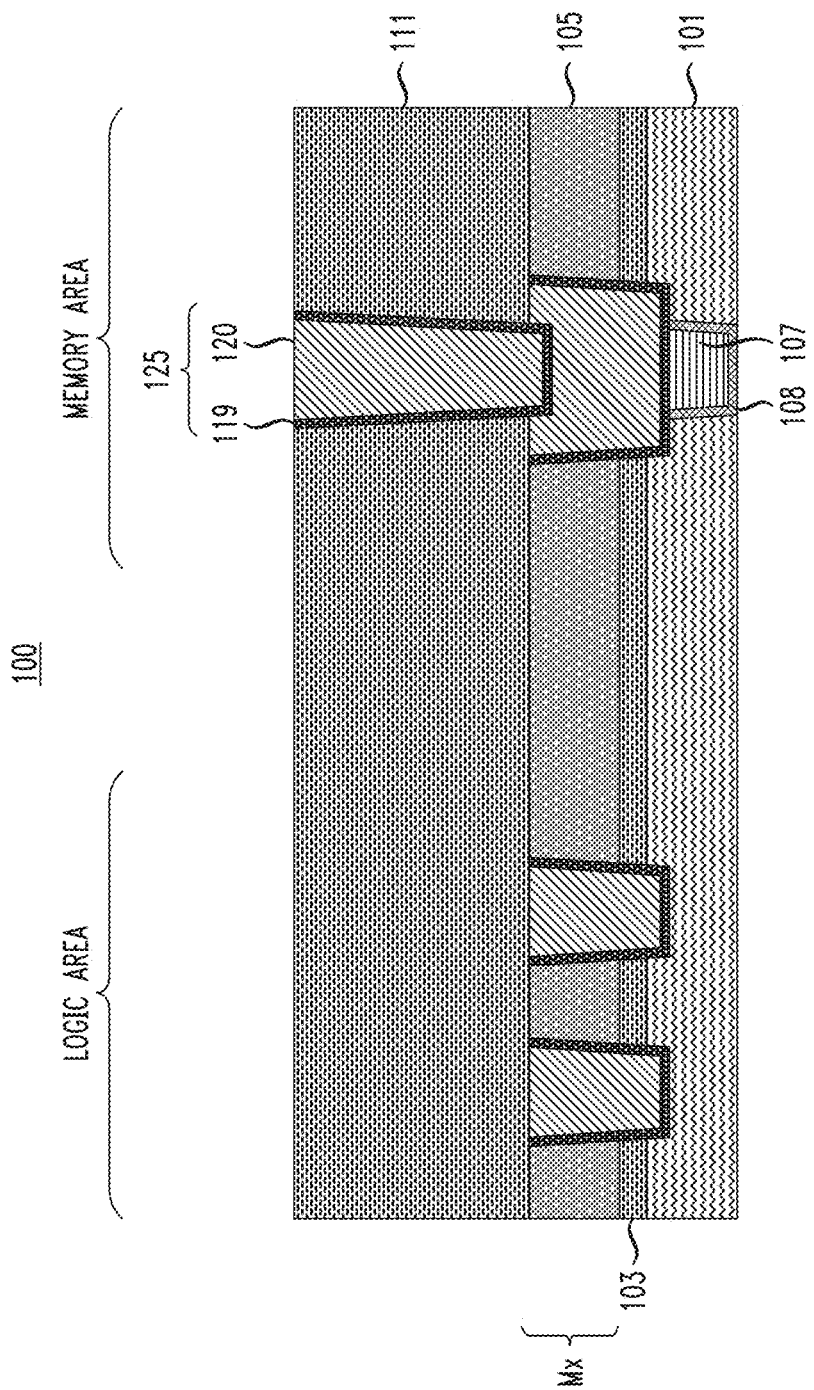
FIG. 3 is a schematic cross-sectional view illustrating formation of a bottom electrode contact in the dielectric cap layer of FIG. 2, according to an embodiment of the invention.

Referring to FIG. 3, a bottom electrode contact 125 is formed in the second cap layer 111. As explained further herein, the bottom electrode contact 125 is a contact for a bottom electrode of a memory device that is subsequently formed on the bottom electrode contact 125. The bottom electrode contact 125 is formed in the memory area and extends onto or partially into a contact in the lower metallization level ($M_x$). Similar to the contacts in the lower metallization level ($M_x$), the bottom electrode contact 125 comprises a fill layer 120 comprising the same or similar materials to those of the fill layers 110 and a liner layer 119 comprising the same or similar materials to those of the liner layers 109. The bottom electrode contact 125 is formed by etching a portion of the second cap layer 111 over the contact in the memory area to form a trench, in which the liner layer 119 and the fill layer 120 are deposited to fill in the trench. The liner and fill layers 119 and 120 are deposited and planarized using the same or similar techniques as those described in connection with the liner and fill layers 109 and 110. As can be seen in FIG. 3, the bottom electrode contact 125 extends through the entire thickness of the second cap layer 111.

Figure 4:
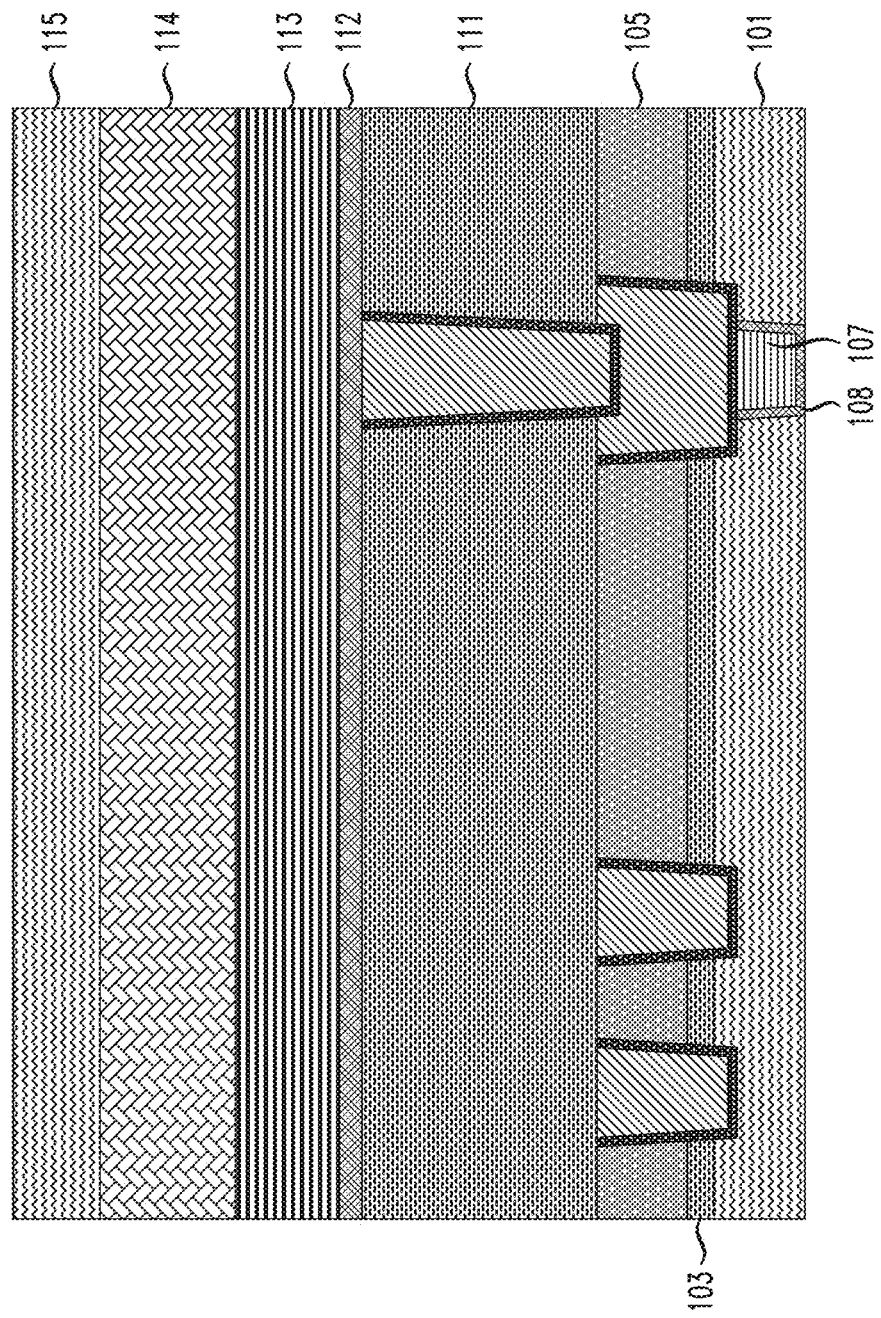
FIG. 4 is a schematic cross-sectional view illustrating formation of memory device layers on the structure of FIG. 3, according to an embodiment of the invention.

Referring to FIG. 4, a plurality of memory device layers including a bottom electrode layer 112, memory element layers 113 (e.g., MTJ layers) and a top electrode layer 114 are deposited on the structure of FIG. 3. A first sacrificial dielectric layer 115 is deposited on the top electrode layer 114.

The bottom electrode layer 112 comprises, for example, TaN, TiN or other suitable conductive metal and the top electrode layer 114 comprises, for example, Nb, NbN, W, WN, Ta, TaN, Ti, TiN, Ru, Mo, Cr, V, Pd, Pt, Rh, Sc, Al and other high melting point metals or conductive metal nitrides. According to an embodiment, the thickness of the top electrode layer 114 is larger than that of the bottom electrode layer 112. For example, the thickness of the bottom electrode layer 112 can be in the range of about 50 angstroms to about 500 angstroms and the thickness of the top electrode layer 114 can be in the range of about 500 angstroms to about 1500 angstroms. The top electrode layer 114 is formed on the memory element layers 113, and the memory element layers 113 are formed on the bottom electrode layer 112. In the case of an MRAM, the memory element layers 113 include an MTJ structure comprising, for example, one or more magnetic fixed layers, non-magnetic barrier layers, free layers and oxide layers. The memory element layers 113 are not limited to those of an MRAM, and can include layers for memory elements of, for example, PCRAM, RRAM, ReRAM or other non-volatile memory devices. The first sacrificial dielectric layer 115 comprises the same or similar material to that of the lower dielectric layer 101, and is deposited on the top electrode layer 114. The bottom electrode layer 112, memory element layers 113, top electrode layer 114, and first sacrificial dielectric layer 115 are deposited using, for example, one or more deposition techniques, such as, but not necessarily limited to, PVD, CVD, ALD, PECVD, RFCVD, MLD, MBD, LSMCD and/or sputtering.

Figure 5:
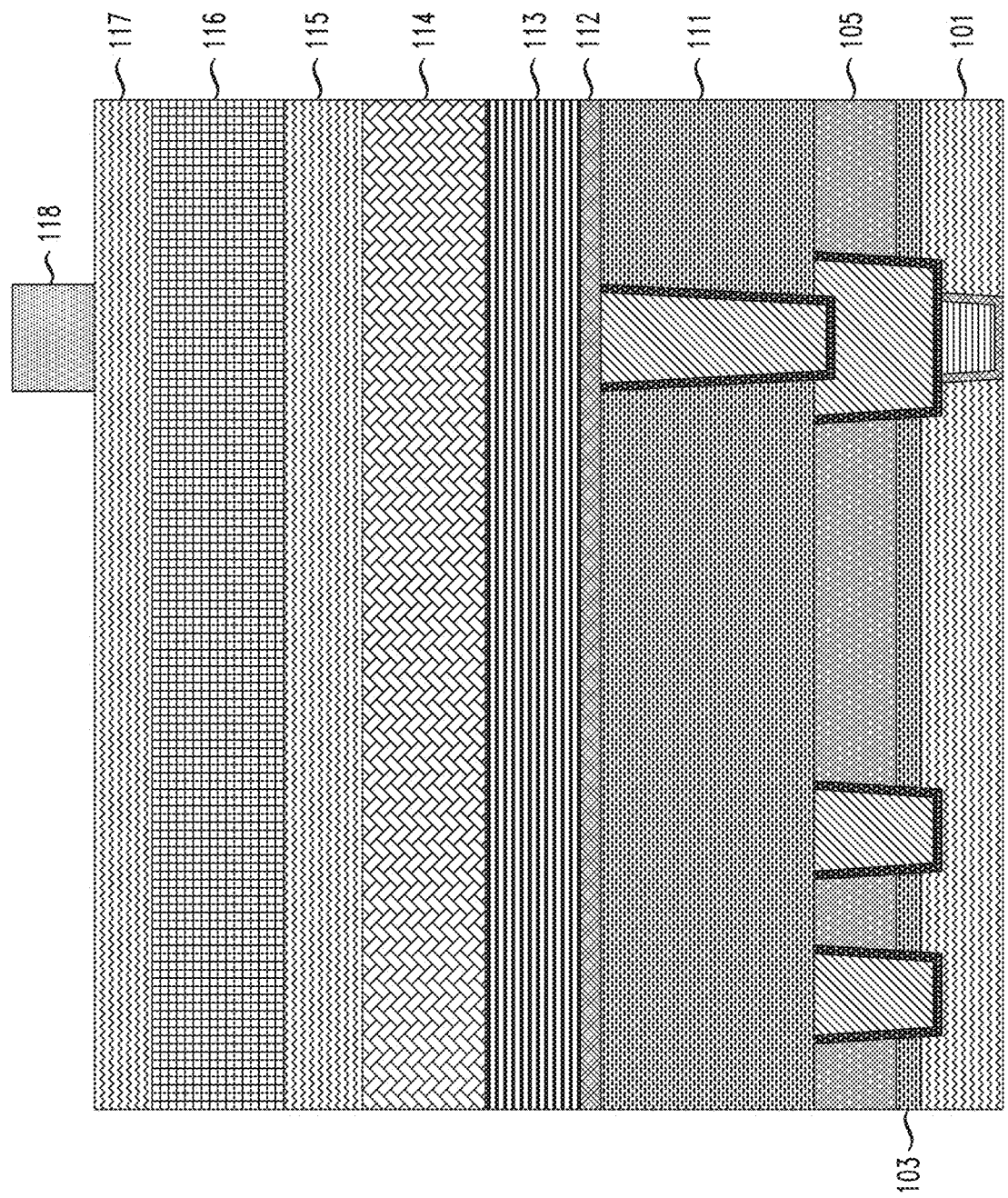
FIG. 5 is a schematic cross-sectional view illustrating formation of mask layers on the structure of FIG. 4 for patterning the memory device layers, according to an embodiment of the invention.

Referring to FIG. 5, an organic planarization layer (OPL) 116 is formed on the first sacrificial dielectric layer 115 and a second sacrificial dielectric layer 117 is formed on the OPL 116. According to an embodiment, the second sacrificial dielectric layer 117 comprises a silicon anti-reflective coating (SiARC) layer or a material the same or similar to that of the first sacrificial dielectric layer 115.

The OPL 116 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 116 can be deposited, for example, by spin coating, to a thickness of about 100 nm-about 200 nm.

A photoresist 118 is formed on the second sacrificial dielectric layer 117 in a region corresponding to the bottom electrode contact 125, and where the memory device layers comprising the bottom electrode layer 112, the memory element layers 113 and the top electrode layer 114 are to be patterned into a memory device. The photoresist 118 has a thickness in the range of about 80 nm to about 110 nm, and a horizontal width which corresponds to that of the bottom electrode contact 125 and a desired width of the resulting memory device.

Figure 6:
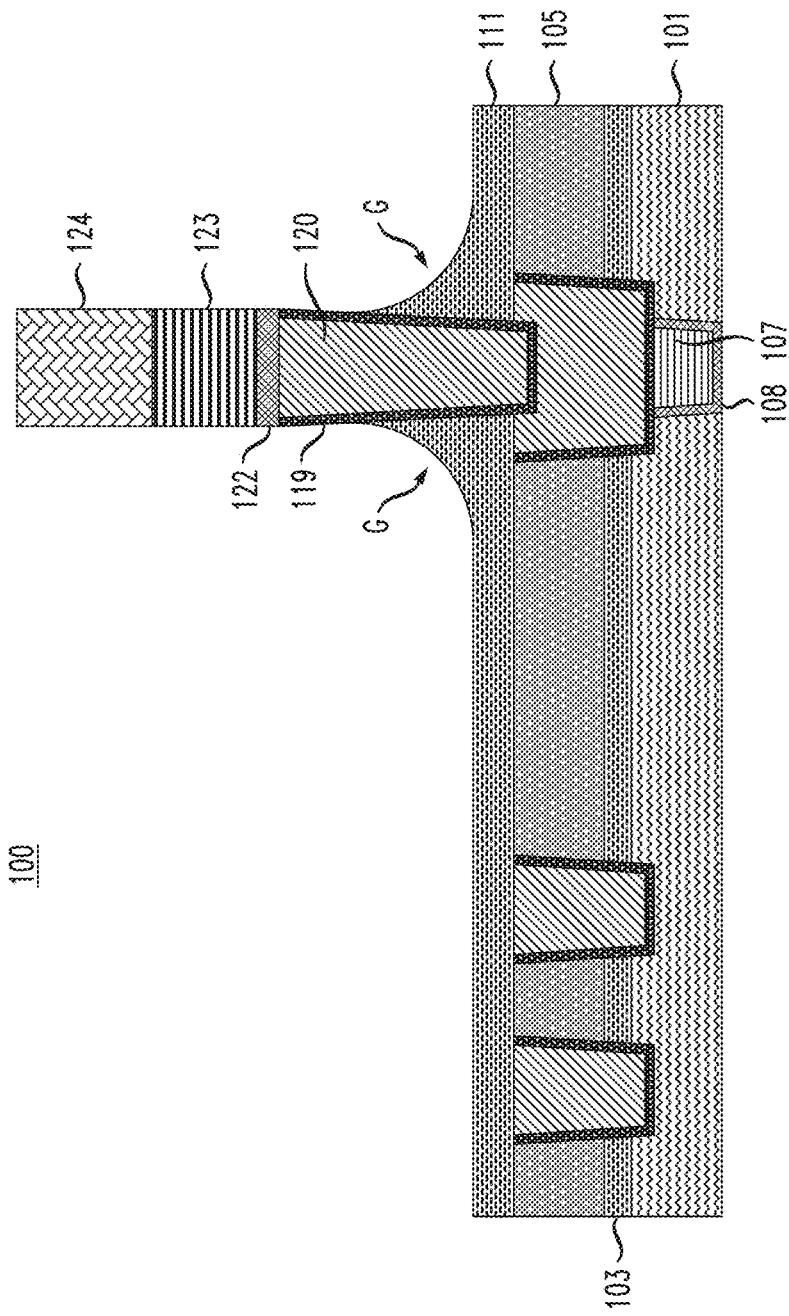
FIG. 6 is a schematic cross-sectional view illustrating patterning of the memory device layers of the FIG. 5 structure, according to an embodiment of the invention.

Referring to FIG. 6, exposed portions of the second sacrificial dielectric layer 117, OPL 116 and first sacrificial dielectric layer 115 not under the photoresist 118 are removed by an etching process. The etching process is performed using, for example, a fluorocarbon RIE to remove the exposed portions of the second sacrificial dielectric layer 117, OPL 116 and first sacrificial dielectric layer 115 down to the top electrode layer 114.

According to an embodiment, the photoresist 118, second sacrificial dielectric layer 117 and OPL 116 are removed leaving the patterned first sacrificial dielectric layer 115. The second sacrificial dielectric layer 117 and OPL 116 are removed using, for example, oxygen plasma, nitrogen plasma, hydrogen plasma or other carbon strip or ashing processes. The stripping process causes minimal or no damage to the remaining layers. The patterned first sacrificial dielectric layer 115 remains covering the area corresponding to bottom electrode contact 125, where the memory device will be formed.

Using the first sacrificial dielectric layer 115 as a mask, the top electrode layer 114, memory element layers 113, and bottom electrode layer 112 are patterned into a memory device comprising a top electrode 124, a memory element 123 comprising the patterned memory element layers 113, and a bottom electrode 122. Following patterning, the first sacrificial dielectric layer 115 can be removed using, for example, diluted hydrofluoric acid (DHF). As illustrated in FIG. 6, the patterning process, which comprises for example, RIE and ion beam etch (IBE) processes, removes portions of the second cap layer 111 and creates gouged portions G at a base portion of the bottom electrode contact 125. As can be seen, the gouged portions are carved-out curved portions of the second cap layer 111. According to an embodiment, the gouged portions G are formed around a base portion of the bottom electrode contact 125, and remaining portions of the second cap layer 111 do not extend to an upper portion of the bottom electrode contact 125. For example, the remaining portions of the second cap layer 111 adjacent the bottom electrode contact 125 reach a height at or below about a middle portion of the bottom electrode contact 125.

Figure 7:
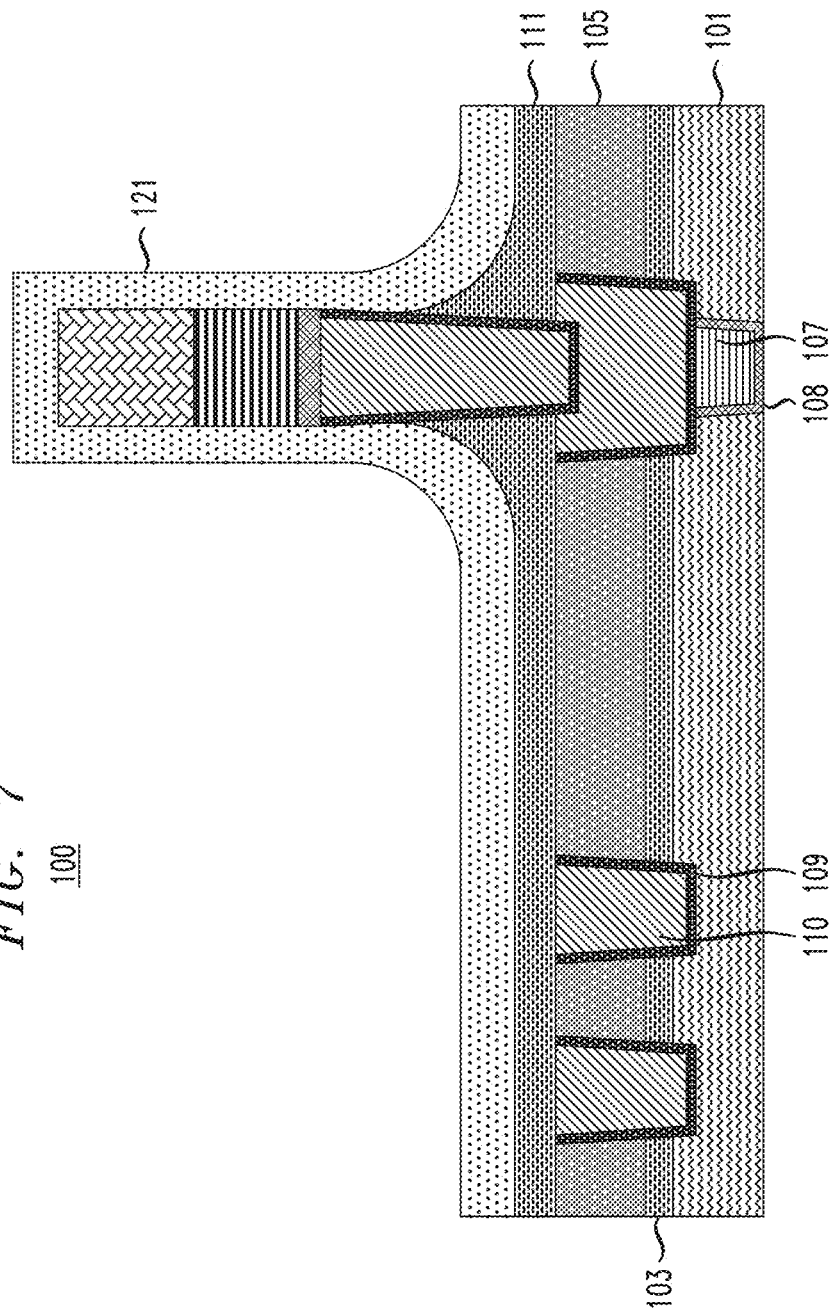
FIG. 7 is a schematic cross-sectional view illustrating deposition of an encapsulation layer on the structure of FIG. 6, according to an embodiment of the invention.

Referring to FIG. 7, an encapsulation layer 121 comprising, for example SiN or SiCN or another nitride, is conformally deposited on the structure of FIG. 6. As can be seen, the encapsulation layer 121 is deposited on the remaining portions of the second cap layer 111, and also on exposed portions of the top electrode 124, memory element 123, bottom electrode 122 and bottom electrode contact 125. The encapsulation layer 121 is formed around the top electrode 124, memory element 123, bottom electrode 122 and bottom electrode contact 125 to encapsulate the stacked structure of the top electrode 124, memory element 123, bottom electrode 122 and bottom electrode contact 125. At the base portion of the bottom electrode contact 125, the gouged portions G of the second cap layer 111 are formed between the encapsulation layer 121 and the sides of the bottom electrode contact 125. Where the encapsulation layer 121 is formed on the gouged portions G, the encapsulation layer 121 has a similar curvature to that of the gouged portions G of the second cap layer 111. The encapsulation layer 121 is deposited using one or more conformal deposition techniques such as, for example, CVD or ALD.

Figure 8:
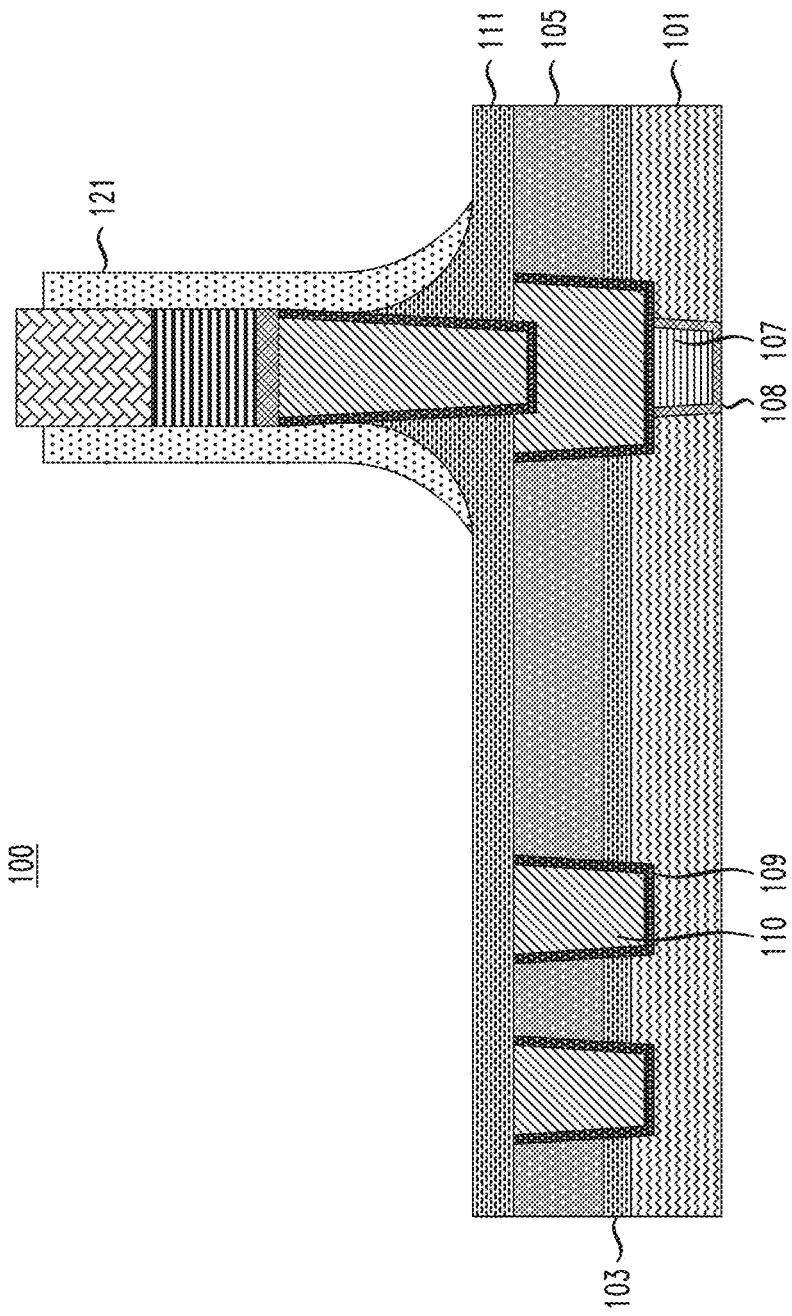
FIG. 8 is a schematic cross-sectional view illustrating etching back of the encapsulation layer from the structure of FIG. 7, according to an embodiment of the invention.

Referring to FIG. 8, portions of the encapsulation layer 121 are removed in, for example, an etchback process, to expose portions of the second cap layer 111 and a top surface and part of side surfaces of the top electrode 124. According to an embodiment, an upper part of the side surfaces of the top electrode 124 is exposed by the removal of the portions of the encapsulation layer 121. Following the etchback process, the encapsulation layer 121 remains around other parts of the side surfaces of the top electrode 124, and around the memory element 123, bottom electrode 122 and bottom electrode contact 125, still encapsulating those portions of the memory device and the bottom electrode contact 125.

Figure 9:
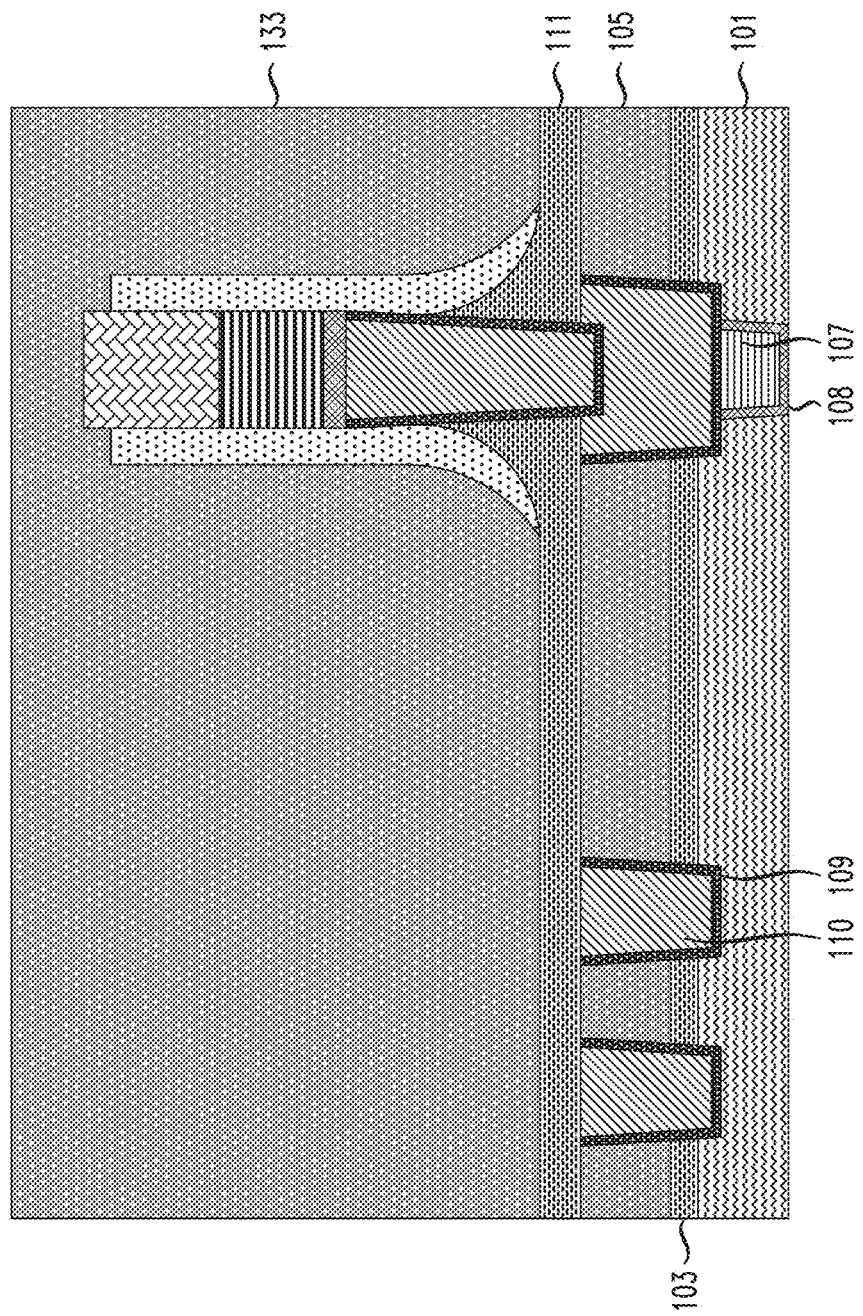
FIG. 9 is a schematic cross-sectional view illustrating deposition of an inter-level dielectric (ILD) layer on the structure of FIG. 8, according to an embodiment of the invention.

Referring to FIG. 9, a second ILD layer 133 is formed on the structure of FIG. 8. The second ILD layer 133 comprises the same or similar materials as those used for the first ILD layer 105, and is deposited using the same or similar deposition techniques as those used in connection with the deposition of the first ILD layer 105, followed by planarization. As can be seen in FIG. 9, a height of the second ILD layer 133 extends beyond a top surface of the top electrode 124. According to an embodiment, a material of the second ILD layer 133 is able to be selectively etched with respect to materials of the encapsulation later 121 and the second cap layer 111.

Figure 10:
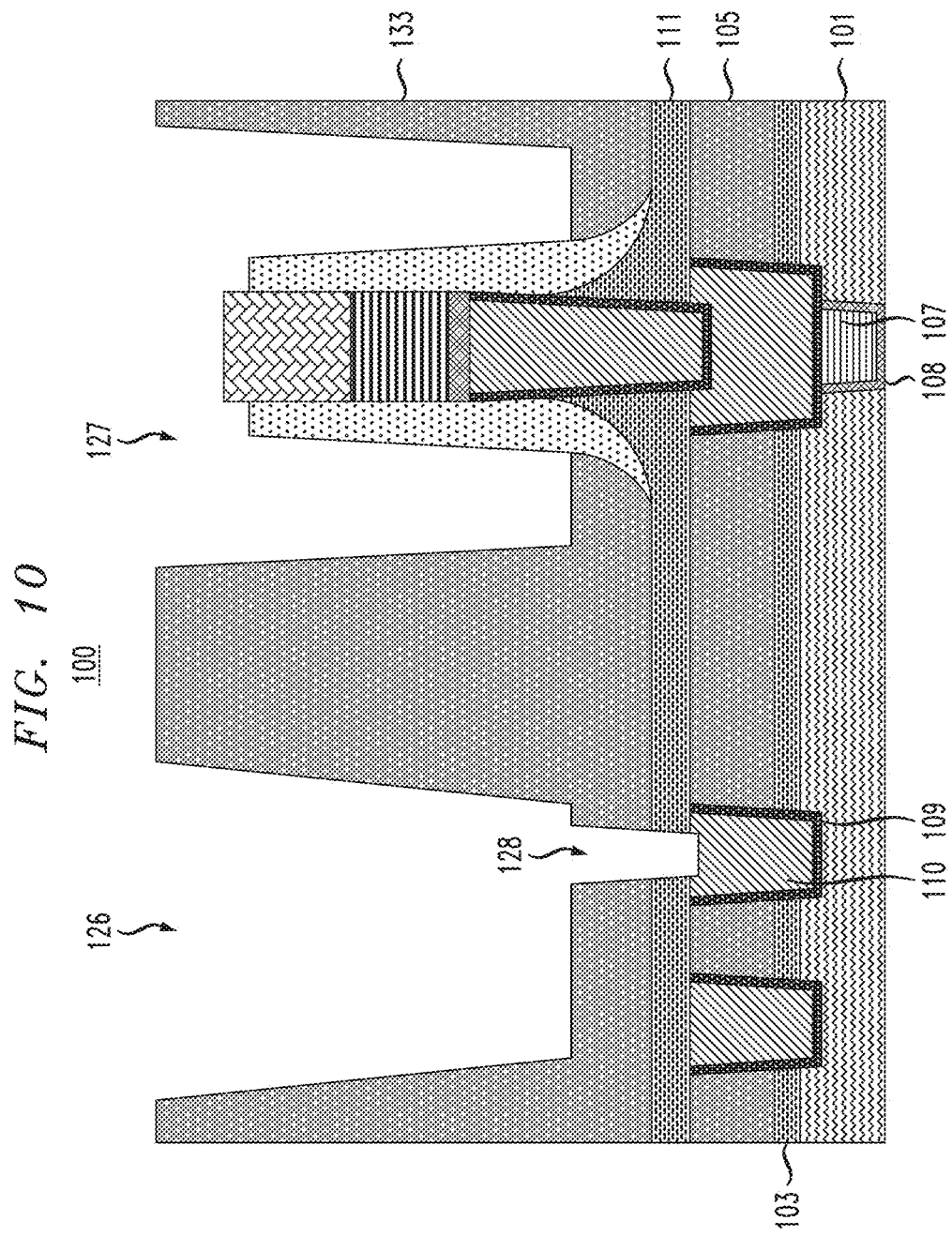
FIG. 10 is a schematic cross-sectional view illustrating contact trench and via opening formation in the deposited ILD layer from FIG. 9, according to an embodiment of the invention.

Referring to FIG. 10, using a dual damascene trench and via opening patterning process, portions of the second ILD layer 133 (e.g., portions not covered by a mask) are etched to form a first upper metallization level trench 126, a second upper metallization level trench 127, and a via opening 128. According to an embodiment, the etching is performed using, for example, a fluorocarbon based RIE. The first upper metallization level trench 126 and via opening 128 are formed in the second ILD layer 133 in the logic area. The via opening 128 under the first upper metallization level trench 126 is further formed through the second cap layer 111, until it reaches one of the contacts in the logic area. The via opening 128 exposes a top surface of the fill layer 110. A height of the bottom electrode contact 125 is greater than a height of the via opening.

The second upper metallization level trench 127 is formed in the memory area over and around the stacked structure of the top electrode 124, the memory element 123 and the bottom electrode 122 on the bottom electrode contact 125. The second upper metallization level trench 127 is selectively etched with respect to the encapsulation layer 121 so that the encapsulation layer 121 remains around the stacked structure of the top electrode 124, the memory element 123, the bottom electrode 122 and the bottom electrode contact 125. The material of the second ILD layer 133 is able to be selectively etched at a faster rate with respect to the encapsulation layer 121 so that the encapsulation layer 121 is not removed. The second upper metallization level trench 127 is formed over the memory device structure and extends downward into the second ILD layer 133 around the sides of the bottom electrode contact 125, the memory device structure stacked on the bottom electrode contact 125 and the sides of the encapsulation layer 121. A top surface of the bottom electrode contact 125 is above a lowermost surface of the second upper metallization level trench 127.

Figure 11:
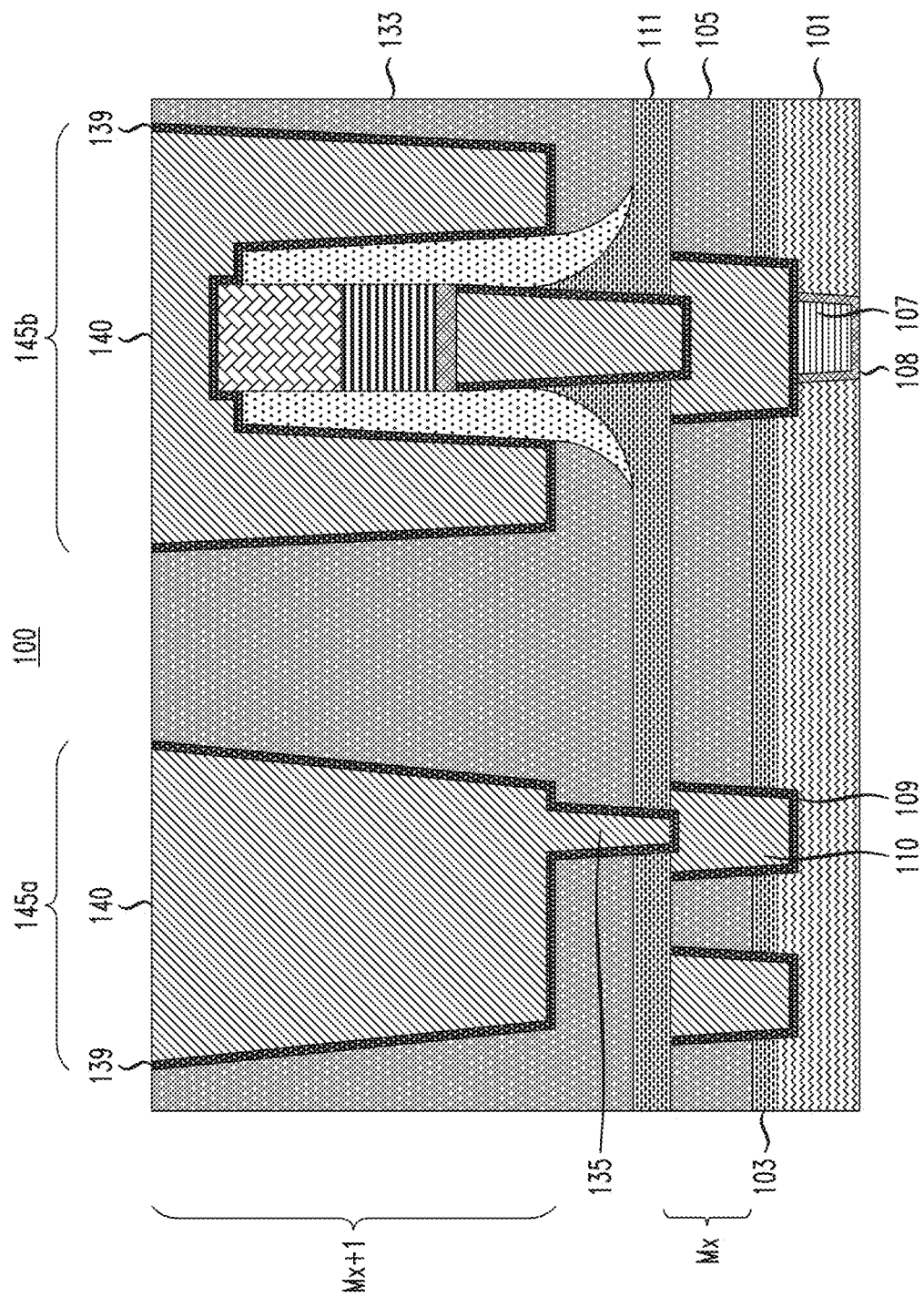
FIG. 11 is a schematic cross-sectional view illustrating contact and via formation in the contact trenches and via opening from the FIG. 10 structure, according to an embodiment of the invention.

Referring to FIG. 11, the first upper metallization level trench 126, the second upper metallization level trench 127 and via opening 128 are filled with liner layers 139 and fill layers 140 to create first contact 145a and second contact 145b in an upper metallization level $M_{x+1}$ and a via 135 between lower metallization level $M_x$ and upper metallization level $M_{x+1}$. According to an embodiment, the first and second contacts 145a and 145b are bit line contacts. As can be seen in FIG. 11, the second contact 145b is disposed on a top surface and on portions of side surfaces of the top electrode 124. The second contact 145b extends downward around sides of the memory device comprising the top electrode 124, memory element 123 and bottom electrode 122. The second contact 145b further extends downward around sides of the bottom electrode contact 125. The encapsulation layer 121 is disposed between the second contact 145b and the sides of the of the bottom electrode contact 125 and the sides of the memory device comprising the top electrode 124, memory element 123 and bottom electrode 122.

A top surface of the bottom electrode contact 125 is above a lowermost surface of the second contact 145b. Portions of the second contact 145b are disposed on top surfaces of the encapsulation layer 121. The encapsulation layer 121 is disposed around the top electrode 124 and a height of the top surfaces of the encapsulation layer 121 is lower than a height of the top surface of the top electrode 124. The via 135 in the logic area connects the first contact 145a in upper metallization level $M_{x+1}$ with the underlying contact in lower metallization level $M_x$. The via 135 is disposed on a side of and spaced apart from the bottom electrode contact 125, and a height of the bottom electrode contact 125 is greater than the height of the via 135.

The fill layers 140 are formed on the liner layers 139. The liner layers 139 and the fill layers 140 comprise the same or similar material as that of the liner layers 109 and fill layers 110. The liner layers 139 are conformally formed on sidewalls and a bottom surface of the first upper metallization level trench 126, the second upper metallization level trench 127 and on sidewalls of the via opening 128. A liner layer 139 may also be formed optionally on an upper surface of the contact below the via opening 128. The liner and fill layers 139 and 140 are deposited using the same or similar techniques to those used for deposition of the liner and fill layers 109 and 110, which can be followed by a planarization process such as, for example, CMP to planarize a top surface of the second ILD layer 133 and remove excess portions of the liner and fill layers 139 and 140. Portions of the liner layer 139 of the second contact 145b are formed on the sides of the encapsulation layer 121.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a bottom electrode contact;
   a memory device comprising a bottom electrode disposed on the bottom electrode contact, at least one memory element layer disposed on the bottom electrode, and a top electrode disposed on the at least one memory element layer;
   a bit line contact disposed on the top electrode and extending around sides of the memory device and of the bottom electrode contact; and
   an encapsulation layer disposed between the bit line contact and the sides of the memory device and of the bottom electrode contact.

2. The semiconductor structure of claim 1, wherein a top surface of the bottom electrode contact is above a lowermost surface of the bit line contact.

3. The semiconductor structure of claim 1, wherein the bit line contact is disposed on a top surface and a portion of a side surface of the top electrode.

4. The semiconductor structure of claim 1, wherein the encapsulation layer is disposed around the sides of the memory device and of the bottom electrode contact.

5. The semiconductor structure of claim 4, wherein the encapsulation layer is disposed around the top electrode and a top surface of the encapsulation layer is lower than a top surface of the top electrode.

6. The semiconductor structure of claim 1, wherein the encapsulation layer comprises a nitride material.

7. The semiconductor structure of claim 1, further comprising a cap layer disposed around a base portion of the bottom electrode contact.

8. The semiconductor structure of claim 7, wherein an uppermost portion of the cap layer is below a top surface of the bottom electrode contact.

9. The semiconductor structure of claim 7, wherein the cap layer comprises a curved profile around a base portion of the bottom electrode contact.

10. The semiconductor structure of claim 9, wherein:
    wherein the encapsulation layer is disposed around the sides of the bottom electrode contact; and
    a portion of the encapsulation layer is disposed on the cap layer along the curved profile.

11. The semiconductor structure of claim 1, further comprising a via connecting two metallization levels, wherein the via is disposed on a side of and spaced apart from the bottom electrode contact, and wherein a height of the bottom electrode contact is greater than a height of the via.

12. The semiconductor structure of claim 1, wherein a portion of the bit line contact is disposed on a top surface of the encapsulation layer.

13. A semiconductor structure, comprising:
an electrode contact disposed in a dielectric layer;
a memory device disposed in the dielectric layer over the electrode contact;
a cap layer disposed around a base portion of the electrode contact and having a curved profile;
wherein a height of the cap layer is less than a height of the electrode contact; and
a via connecting two metallization levels, wherein the via is disposed in the dielectric layer on a side of and spaced apart from the electrode contact, and wherein the height of the electrode contact is greater than a height of the via.

14. The semiconductor structure of claim 13, further comprising a bit line contact disposed on the memory device and extending around sides of the memory device and of the electrode contact.

15. The semiconductor structure of claim 14, further comprising an encapsulation layer disposed around the sides of the memory device and of the electrode contact, and disposed between the bit line contact and the sides of the memory device and of the electrode contact.

16. The semiconductor structure of claim 14, wherein a top surface of the electrode contact is above a lowermost surface of the bit line contact.

17. A method of forming a semiconductor structure, comprising:
forming an electrode contact structure in a dielectric cap layer;
depositing a plurality of memory device layers on the dielectric cap layer;
patterning the plurality of memory device layers to form a memory device structure, wherein the patterning gouges the dielectric cap layer at a base portion of the electrode contact structure;
forming an encapsulation layer on the gouged dielectric cap layer and around the electrode contact structure and the memory device structure;
depositing an inter-level dielectric layer on sides of the electrode contact structure, the memory device structure and the encapsulation layer; and
forming a contact trench in the inter-level dielectric layer, wherein the contact trench is formed over the memory device structure and extends downward into inter-level dielectric layer around the sides of the electrode contact structure, the memory device structure and the encapsulation layer.

18. The method of claim 17, wherein a top surface of the electrode contact structure is above a lowermost surface of the contact trench.

19. The method of claim 17, further comprising forming a via in the inter-level dielectric layer, wherein a height of the electrode contact structure is greater than a height of the via.

20. A semiconductor structure, comprising:
an electrode contact disposed in a dielectric layer;
a memory device disposed in the dielectric layer over the electrode contact;
a cap layer disposed around a base portion of the electrode contact and having a curved profile;
wherein a height of the cap layer is less than a height of the electrode contact; and
a bit line contact disposed on the memory device and extending around sides of the memory device and of the electrode contact, wherein a top surface of the electrode contact is above a lowermost surface of the bit line contact.

* * * * *